United States Patent [19]

Andoh

[11] Patent Number: 5,529,069
[45] Date of Patent: Jun. 25, 1996

[54] MAGNETIC RESONANCE IMAGING APPARATUS

[75] Inventor: Akihide Andoh, Kyoto, Japan

[73] Assignee: Shimadzu Corporation, Kyoto, Japan

[21] Appl. No.: 274,458

[22] Filed: Jul. 13, 1994

[30] Foreign Application Priority Data

Jul. 22, 1993 [JP] Japan ................... 5-202828

[51] Int. Cl.$^6$ ............................................. A61B 5/055
[52] U.S. Cl. ..................... 128/653.5; 324/309; 324/322
[58] Field of Search ........................ 128/653.2, 653.5; 324/307, 309, 318, 322

[56] References Cited

FOREIGN PATENT DOCUMENTS

| 0238962 | 9/1987 | European Pat. Off. . |
| 0271123 | 6/1988 | European Pat. Off. . |
| 61-148358 | 7/1986 | Japan . |

OTHER PUBLICATIONS

2389 Medical Physics 15 (1988) Mar./Apr., No. 2, New York, NY, USA, pp. 241–245, "Correction for Intensity Falloff in Surface Coil Magnetic Resonance Imaging".

2389 Medical Physics 13 (1986) Nov.Dec., No. 6, Woodbury, NY, USA, pp. 806–814, "Phase and Sensitivity of Receiver Coils in Magnetic Resonance Imaging".

IEEE Transactions on Nuclear Science, vol. 40, No. 4, Aug. 1993, pp. 1169–1173, "Accurate Intensity Correction for Endorectal Surface Coil MR Imaging of the Prostate".

Medical Physics 12 (5), Sep./Oct. 1985, pp. 586–591, "Noise and Filtration in Magnetic Resonance Imaging".

*Primary Examiner*—Ruth S. Smith
*Attorney, Agent, or Firm*—Nikaido, Marmelstein, Murray & Oram

[57] ABSTRACT

A magnetic resonance imaging apparatus includes a surface coil for receiving NMR signals released from an examinee, and an image generating unit for generating a sectional image (original image) based on the signals received. A sensitivity distribution identifier obtains sensitivity distribution data of the surface coil for each pixel in the original image by extracting low frequency components from spatial frequency of the image. A correction factor calculator derives correction factor data by substituting a predetermined function into the sensitivity distribution data. An output image calculator determines an image (output image) with improved luminance by calculating, for each pixel, a product of luminance of each pixel in the original image and the correction factor data.

8 Claims, 5 Drawing Sheets

MAGNETIC RESONANCE IMAGING APPARATUS

BACKGROUND OF THE INVENTION

(1) Field of the Invention

This invention relates to magnetic resonance imaging apparatus (or MRI apparatus), and more particularly to a technique of remedying a lack of uniformity in the luminance of sectional images obtained with MRI apparatus.

(2) Description of the Related Art

In an MRI apparatus for obtaining sectional images of a particular site such as a shoulder or the spinal column of an examinee, a surface coil is often employed as a coil for receiving nuclear magnetic resonance signals (hereinafter referred to as NMR signals also) released from the examinee. This is because the surface coil provides sectional images of high signal-to-noise ratio. However, the surface coil has such a characteristic that its reception sensitivity lowers with an increase in the distance between the surface coil and an NMR signal source. This results in a lack of uniformity in the sensitivity distribution over an entire sectional image, and hence non-uniformity in the luminance of the sectional image obtained.

Generally, luminance $i(x, y)$ of each pixel in a sectional image obtained (assuming that the sectional image is in x, y plane) may be expressed by a product of luminance $j(x, y)$ of each pixel in an image which should be obtained if the surface coil had a uniform sensitivity distribution, and sensitivity distribution data $\alpha(x, y)$ (where $0 \leq \alpha(x, y) \leq 1$) of the surface coil for each pixel in the image, as in the following equation:

$$i(x, y) = j(x, y) * \alpha(x, y) \quad (1)$$

Thus, luminance $j(x, y)$ of each pixel in the image which should be obtained if the surface coil had a uniform sensitivity distribution is derived, in conventional practice, from luminance $i(x, y)$ of each pixel in the sectional image actually obtained, using the following equation:

$$\begin{aligned} j(x, y) &= i(x, y)/\alpha(x, y) \\ &= i(x, y) * (1/\alpha(x, y)) \end{aligned} \quad (2)$$

Conventionally, the sensitivity distribution data of the surface coil is determined by the following methods:

Method 1:
The sensitivity distribution data of the surface coil is calculated by magnetic field analysis.

That is, based on a positional relationship between each pixel in the sectional image obtained and the surface coil, a pixel for which the surface coil is capable of receiving NMR signals with the best sensitivity is identified by magnetic field analysis. The sensitivity of the surface coil for that pixel is set to "1" (maximum sensitivity). Next, reception sensitivity ratios of the other pixels with respect to the sensitivity "1" pixel are computed by magnetic field analysis, based on positional relationships between these pixels and the surface coil. Sensitivity levels of the surface coil for the pixels are determined to obtain sensitivity distribution data $\alpha(x, y)$.

Method 2:
A uniform phantom is photographed with the MRI apparatus, and sensitivity distribution data $\alpha(x, y)$ of the surface coil is determined from variations in luminance based on the sensitivity distribution in a sectional image obtained.

Method 3:
Data consisting of low frequency components of spatial frequency of a sectional image obtained with the MRI apparatus is regarded as approximately corresponding to sensitivity distribution data $\alpha(x, y)$ of the surface coil. Generally, the sensitivity distribution of the surface coil has a gentle gradient, and its spatial frequency is composed mainly of low frequency components. A smoothing filter is applied to the sectional image influenced by such a sensitivity distribution, to extract the low frequency components. These low frequency components are normalized in the range of 0 to 1, to be regarded as approximately corresponding to sensitivity distribution data $\alpha(x, y)$ of the surface coil.

When sensitivity distribution data $\alpha(x, y)$ has been determined by either of these methods, luminance $i(x, y)$ of each pixel in the image actually obtained and sensitivity distribution data $\alpha(x, y)$ of the surface coil for that pixel are substituted into the above equation (2), to derive a sectional image which should be obtained if the surface coil had a uniform sensitivity distribution, i.e. a sectional image with improved uniformity in luminance.

However, the following problems arise from the use of the foregoing methods to determine the sensitivity distribution of the surface coil:

Where sensitivity distribution data is determined by Method 1, a long time is consumed in calculation. In addition, the sensitivity distribution data must be calculated all over again each time a change is made in the shape or position of the surface coil.

Method 2 involves the trouble of photographing a phantom with the MRI apparatus in order to determine the sensitivity distribution of the surface coil in advance. Moreover, this method requires complex processing to establish an alignment between the sectional image of an examinee photographed with the MRI apparatus and the sensitivity distribution data determined in advance.

Method 3 extracts, each time a sectional image is obtained from an examinee, low frequency components included in the sectional image, and determines approximate sensitivity distribution data of the surface coil Thus, calculation may be carried out in a much shorter time than determining sensitivity distribution data by magnetic field analysis. There is no need to calculate sensitivity distribution data of the surface coil all over again, which is time-consuming, each time a change is made in the shape or position of the surface coil. Further, the sensitivity distribution of the surface coil need not be determined in advance or aligned with sectional images of an examinee. Thus, this method is free from the drawbacks of Methods 1 and 2.

However, Method 3 has the following, different drawback.

In Method 3, low frequency components are extracted from a photographed sectional image to determine sensitivity distribution data. In background portions of the photographed sectional image from which the site under examination is absent, the image value, with noise components excluded, is zero regardless of the sensitivity. The sensitivity distribution data of the background portions determined tends to be small (near zero), representing a sensitivity widely different from actual sensitivity. Consequently, when luminance is corrected with the above equation (2) based on the sectional image photographed and sensitivity distribution data determined, the luminance becomes stressed for the background portions. This results in excessive emphasis placed on noise components appearing in the background portions, thereby lowering image quality.

SUMMARY OF THE INVENTION

This invention has been made having regard to the state of the art noted above. The object of the invention, therefore, is to provide an MRI apparatus having image correcting functions to derive sensitivity distribution data of a surface coil from a photographed sectional image in a short time, and to effect a luminance correction for excellent image quality without emphasizing noise in background portions of the image.

The above object is fulfilled, according to this invention, by a magnetic resonance imaging apparatus for obtaining sectional images based on nuclear magnetic resonance signals (NMR signals) released from an examinee and received by a surface coil, the apparatus comprising:

- a sensitivity distribution identifier for obtaining sensitivity distribution data of the surface coil by extracting low frequency components from spatial frequency of a sectional image obtained;
- a correction factor calculator for deriving correction factor data from the sensitivity distribution data, the correction factor data taking a value smaller than an inverse of a minimum value of the sensitivity distribution data when the sensitivity distribution data approaches the minimum value, and a value substantially corresponding to an inverse of a maximum value of the sensitivity distribution data when the sensitivity distribution data approaches the maximum value; and
- an output image calculator for calculating a sectional image with improved luminance by applying the correction factor data to the sectional image obtained.

First, the sensitivity distribution identifier obtains sensitivity distribution data of the surface coil by extracting low frequency components from spatial frequency of a sectional image obtained with the MRI apparatus. Next, the correction factor calculator derives correction factor data from the sensitivity distribution data received from the sensitivity distribution identifier. Then, the output image calculator calculates a sectional image with improved luminance by applying the correction factor data calculated by the correction factor calculator to the sectional image photographed. The correction factor data calculated by the correction factor calculator takes a value smaller than an inverse of a minimum value of the sensitivity distribution data when the sensitivity distribution data approaches the minimum value, and a value substantially corresponding to an inverse of a maximum value of the sensitivity distribution data when the sensitivity distribution data approaches the maximum value. Consequently, the sectional image obtained by the output image calculator has high sensitivity portions corrected with the same effect as in the prior art, while suppressing the luminance correction for portions of the original image having low sensitivity, such as background portions, thereby avoiding emphasis placed on noise components of such portions to produce an output image with a properly corrected luminance. The sensitivity distribution data is determined by approximation from the sectional image obtained, and therefore a far shorter time is consumed in calculation than where sensitivity distribution data is determined by magnetic field analysis. This invention dispenses with a time-consuming operation to calculate sensitivity distribution data all over again each time a change is made in the shape or position of the surface coil. Further, there is no need to determine a sensitivity distribution in advance and align the sensitivity distribution with sectional images of an examinee.

The sensitivity distribution identifier may obtain the sensitivity distribution data of the surface coil by effecting a smoothing process on the sectional image obtained, and extracting low frequency components from the spatial frequency of the sectional image. This achieves a high-speed calculation of the sensitivity distribution data.

The sensitivity distribution identifier may effect a maximum filtering process on the sectional image obtained, effect the smoothing process on results of the maximum filtering process, and extract low frequency components from the spatial frequency of the sectional image obtained. This allows sensitivity distribution data to be obtained with high precision also for a photographed image having large dark areas. Further, the correction factor calculator may derive the correction factor data by substituting sensitivity distribution data $\alpha(x, y)$ (which is normalized in a range of 0 to 1) received from the sensitivity distribution identifier, into equation $f(\alpha)=\alpha^2-3\alpha+3$. This assures procurement of proper correction factor data.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

A preferred embodiment of this invention will be described in detail hereinafter with reference to the drawings.

Figure 1:
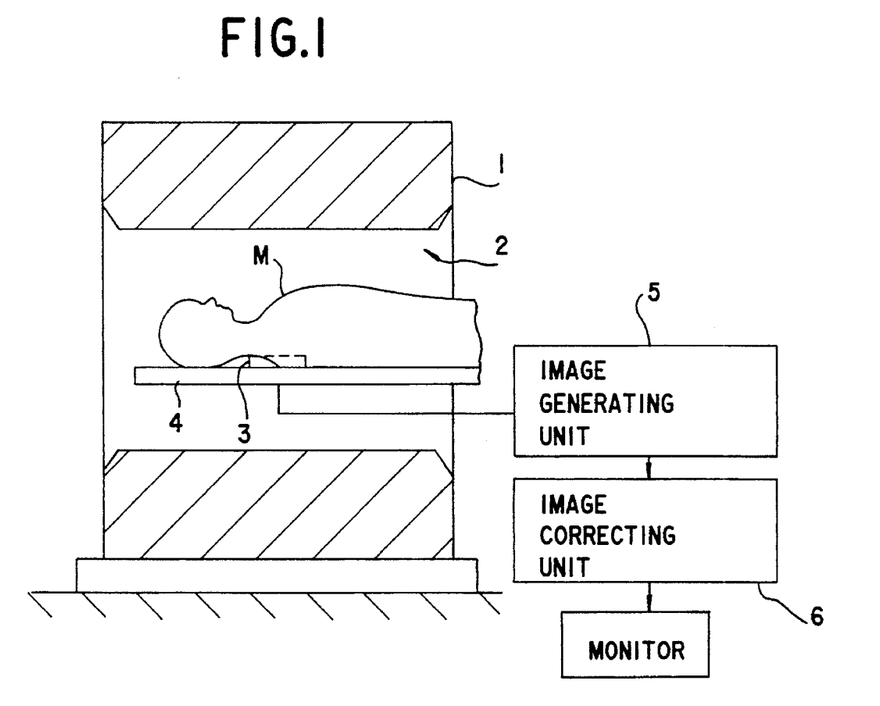
FIG. 1 is a view showing an outline of an MRI apparatus embodying of this invention.

In FIG. 1, gantry 1 includes a static magnetic field forming coil, an inclined magnetic field forming coil, a high frequency pulse generating coil and the like, none of these components being shown in the drawings. A top board 4 supports an examinee M with a site to be photographed (e.g. a shoulder) lying directly over a surface coil 3. The examinee M is introduced in this state into an opening 2 of the gantry 1 for photography.

Photographs are taken as follows. The inclined magnetic field forming coil is driven to superpose a linear magnetic field on a static magnetic field formed by the static magnetic field forming coil, in order to provide positional information for use in tomographic image analysis. Then, the high frequency pulse generating coil is driven to generate high frequency pulses for exciting nuclear magnetic resonance in the examinee's body. NMR signals subsequently generated are received by the surface coil 3.

The NMR signals received are applied to an image generating unit 5 to generate a sectional image. As described hereinbefore, the sectional image thus obtained lacks in uniformity of luminance since the surface coil 3 has a non-uniform sensitivity distribution for the entire sectional image. Thus, the image generating unit 5 transfers the sectional image obtained to an image correcting unit 6 to realize a sectional image having a suitably corrected luminance. The sectional image outputted from the image correcting unit 6 is displayed, for example, on a monitor not shown.

Figure 2:
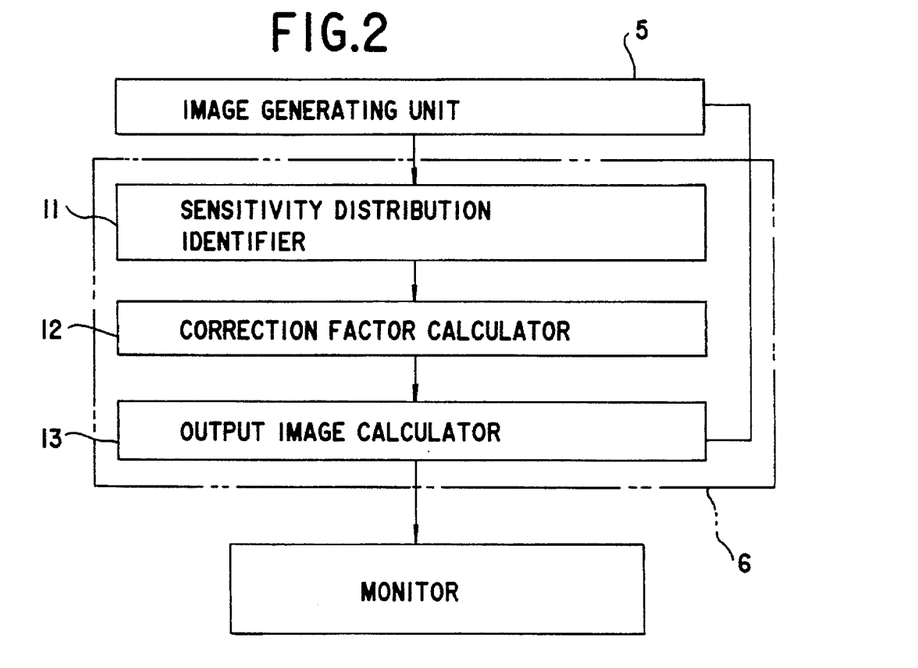
FIG. 2 is a block diagram showing an image correcting unit for correcting sectional images obtained with the MRI apparatus.

A construction of the image correcting unit 6 will be described with reference to FIG. 2.

The sectional image received by the image generating unit 5 (hereinafter referred to as "original image") is first applied to a sensitivity distribution identifier 11. The sensitivity distribution identifier 11 extracts low frequency components from spatial frequency of the original image, and determines sensitivity distribution data of the surface coil 3. This sensitivity distribution data is applied to a correction factor calculator 12. Based on the sensitivity distribution data, the correction factor calculator 12 calculates correction factor data with a predetermined function. Finally, an output image calculator 13 applies the correction factor data calculated by the correction factor calculator 12 to the original image received from the image generating unit 5, to calculate and output an image having an improved luminance uniformity (hereinafter referred to as "output image").

Next, the components of the image correcting unit 6 will particularly be described.

The way in which the sensitivity distribution identifier 11 determines sensitivity distribution data of the surface coil 3 will be described first.

Figure 3:
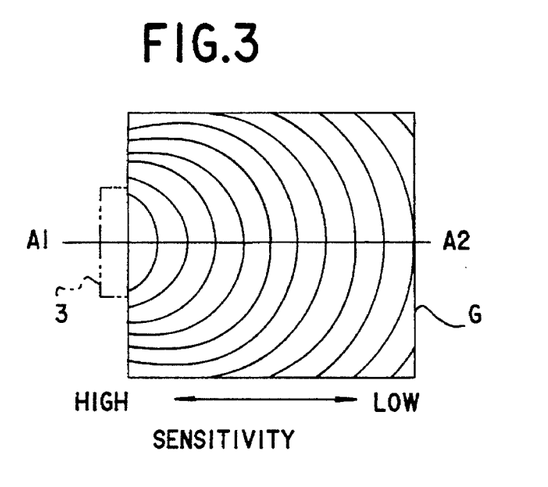
FIG. 3 is a view showing a sensitivity distribution of a surface coil in relation to an image.
Figure 4A:
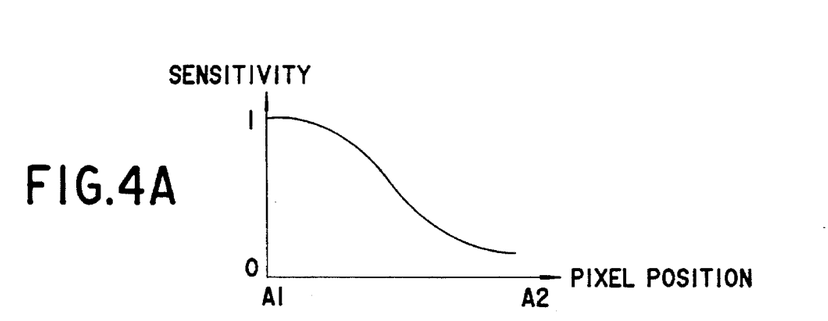
FIG. 4A is a view showing a sensitivity distribution in relation to a pixel arrangement.

As shown in FIG. 3, the sensitivity distribution of the surface coil 3 with respect to original image G describes gradual variations as in contour lines according to distances from the surface coil 3. FIG. 4A shows variations in the sensitivity distribution for pixels lying along line A1–A2 in FIG. 3. In the graph of FIG. 4A, the horizontal axis represents positions of the pixels, while the vertical axis represents sensitivity variations (0 to 1). Sensitivity "1" refers to the highest sensitivity, and sensitivity "0" the lowest.

Figure 5A:
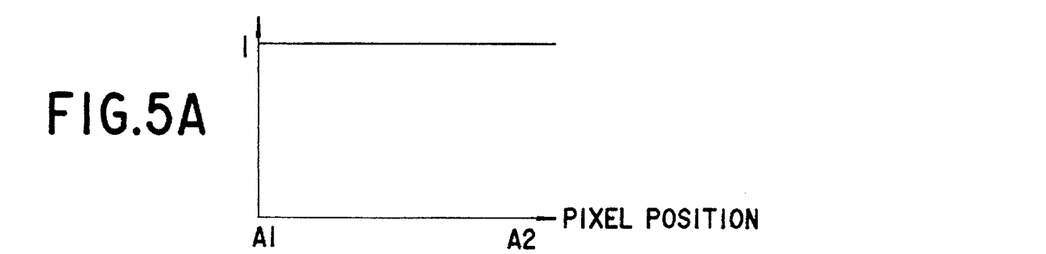
FIG. 5A is a view showing a sensitivity distribution in relation to the pixel arrangement, in a uniform sensitivity condition.
Figure 5B:
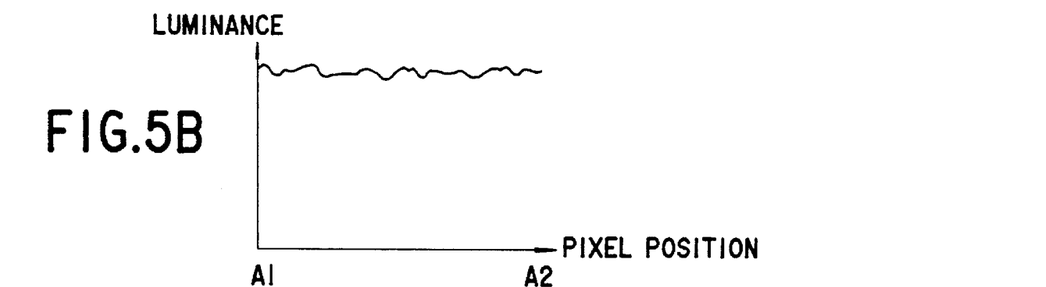
FIG. 5B is a view showing luminance in relation to a pixel arrangement in a sectional image, which is obtained in the uniform sensitivity condition.

On the other hand, assuming that the sensitivity were "1" for all the pixels as shown in FIG. 5A, a sectional image photographed of a particular site of an examinee would have luminance as shown in FIG. 5B. In FIG. 5B, the horizontal axis represents positions of the pixels, and the vertical axis luminance variations.

When the same particular site as in FIG. 5B is photographed under the sensitivity condition shown in FIG. 4A, the resulting sectional image will have the luminance which, as noted hereinbefore, corresponds to the product of the sensitivity of FIG. 4A and the luminance of FIG. 5B. This luminance is shown in FIG. 4B.

Figure 4B:
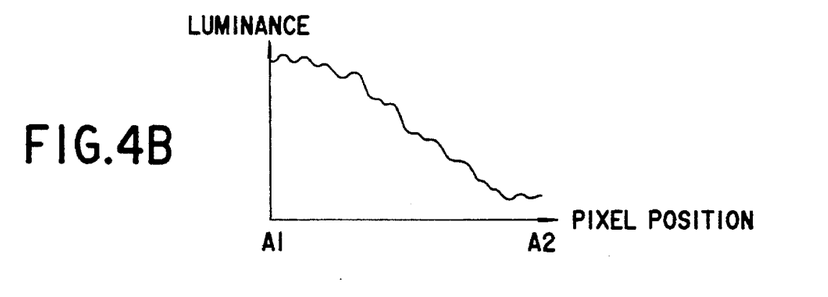
FIG. 4B is a view showing luminance in relation to the pixel arrangement.

It is known that the sensitivity distribution shown in FIG. 4A is obtained by approximation by extracting low frequency components from spatial frequency of the sectional image (original image) having the luminance shown in FIG. 4B, and normalizing the extracted data in the range of 0 to 1. The low frequency components may be extracted from the spatial frequency of the original image, for example, by a method of smoothing luminance of the pixels in predetermined unit regions of the original image (i.e. a smoothing process).

The sensitivity distribution identifier 11 determines sensitivity distribution data by approximation by extracting the low frequency components from the spatial frequency of the original image by the above method, for example, and normalizing the extracted data in the range of 0 to 1.

Figure 6A:
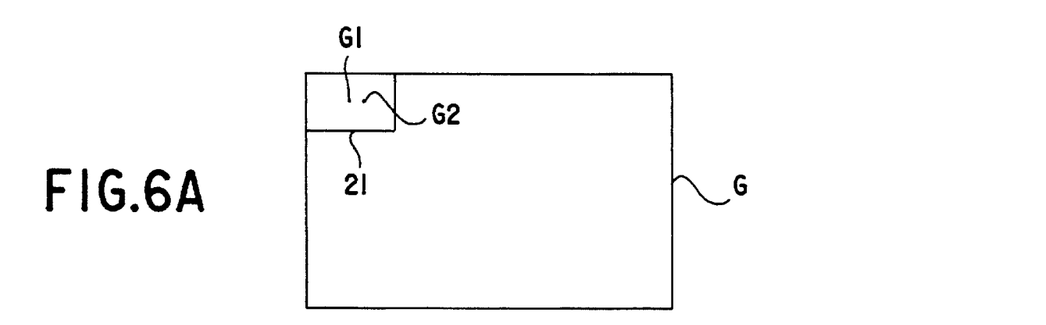
FIGS. 6A and 6B are explanatory views of a sequence of extracting low frequency components from spatial frequency of an original image.
Figure 6B:
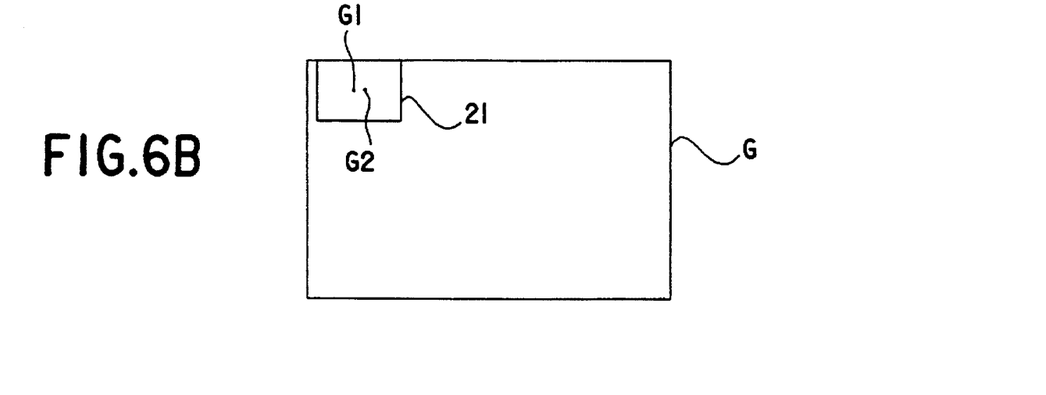

Specifically, as shown in FIGS. 6A and 6B, the luminance of the pixels is smoothed for each portion of the original image G, such as each region 21 of a fraction of the original image G. For pixel G1, for example, an average luminance value of all pixels in the region 21 shown in FIG. 6A is stored as the luminance of pixel G1 in a memory not shown. After pixel G1, the smoothing process is carried out for a next pixel G2 to the right. The smoothing process for pixel G2 is carried out by shifting the region 21 from the position shown in FIG. 6A rightward by one pixel to the position shown in FIG. 6B. Again, an average luminance value of all pixels in the region 21 shown in FIG. 6B is stored as the luminance of pixel G2 in the memory not shown. The same luminance smoothing process is repeated for all the remaining pixels, whereby the memory stores the low frequency components extracted from the spatial frequency of the original image. Depending on the position of a pixel for which the smoothing process is carried out, the region 21 may overflow an end of the image. In such a case, the region 21 is established (or secured) by regarding upper and lower ends or left and right ends of the image as connected to each other.

The size of smoothing region 21 can vary, as long as the luminance smoothing process is effected for pixels in a wide range. For example, the smoothing region 21 may be a quarter or half the size of the original image, or may be fixed regardless of the size of the original image. Further, the region 21 is not limited to the rectangular shape as shown, but may be circular.

The above smoothing process is carried out for each pixel by obtaining an average value of all the pixels in the region 21. However, the smoothing process may be carried out for each pixel by obtaining a simple sum of all the pixels in the region 21. (For pixel G1, for example, a simple sum of all the pixels in the region 21 shown in FIG. 6A is regarded as the luminance of G1. This applies to the other pixels.) The smoothing process may be carried out for each pixel by obtaining a simple sum of all the pixels in the region after weighting all the pixels. An average may be obtained by dividing the weighted simple sum by the number of pixels in the region 21. In this case, the greatest weight is given to the central pixel in the region 21 (e.g. pixel G1 in FIG. 6A), and progressively less weights to the pixels toward the peripheries.

Figure 7A:
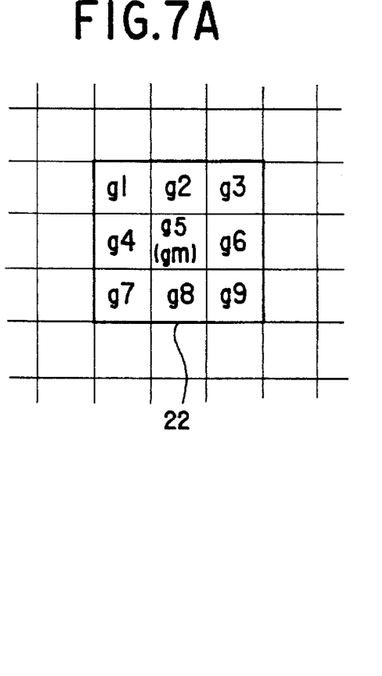
FIGS. 7A through 7C are explanatory views of a different sequence of extracting low frequency components from spatial frequency of an original image.
Figure 7B:
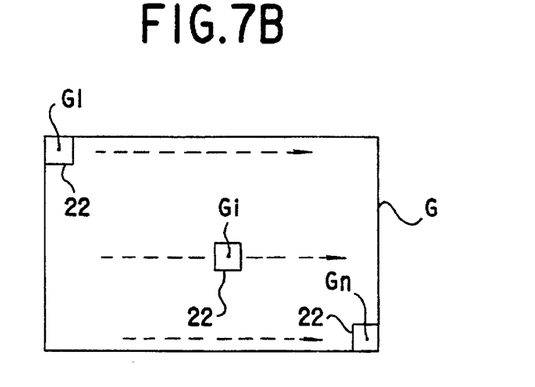
Figure 7C:
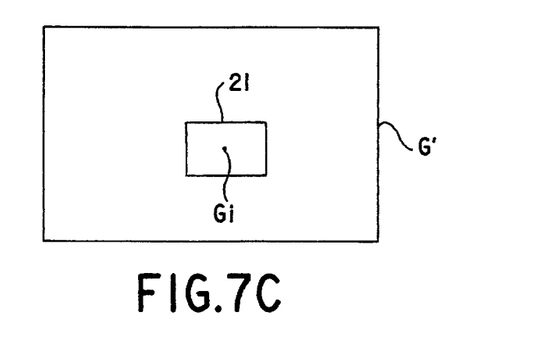

A maximum filtering process may be carried out for the original image prior to the above smoothing process. In this maximum filtering process, each pixel is replaced with a maximum luminance of pixels within a local region surrounding that pixel. Specifically, as shown in FIG. 7A, a certain pixel g5 is regarded as a subject pixel "gm" lying within a local region 22 (which includes nine pixels in the drawing). A maximum luminance among the pixels g1–g9 in the local region 22 is extracted, and the luminance of subject pixel "gm" (g5) is replaced with the maximum luminance extracted. As shown in FIG. 7B, all pixels Gi in the original image G (i=1 to n, n being the number of pixels in the original image G) are successively regarded as subject pixel "gm", and the process shown in FIG. 7A is carried out for each successive local region 22. The results of these processes are stored in a first memory not shown. Consequently, the first memory stores an image in which the luminance of each pixel Gi has been replaced with the maximum luminance extracted from the local region 22 surrounding the pixel Gi. Next, as shown in FIG. 7C, a region 21 for smoothing is set to the image G' stored in the first memory. An average value (or a simple sum, a weighted simple sum or a weighted average) of all the pixels in the region 21 is regarded as luminance of pixel Gi in the center of the region 21, which is stored in a second memory not shown. The smoothing process is carried out by shifting the region 21 for each successive pixel as described hereinbefore. Thus, these processes may also be used to extract the low frequency components from the spatial frequency of the original image.

Effecting only the smoothing process described hereinbefore has the advantage of short processing time. When processing an image having large areas of darkness, however, the luminance of pixels in the dark areas will also be smoothed, and the low frequency components thereby extracted will include errors. The maximum filtering process (i.e. the process of replacing the luminance of each subject pixel with the maximum luminance in the local region around that pixel) carried out prior to the smoothing process requires a longer processing time than the smoothing process alone, but assures an improved precision in extracting the low frequency components from the spatial frequency of an image having large areas of darkness.

In another method, a low-pass filter may be used to extract the low frequency components from the spatial frequency of the original image. That is, an FFT (fast Fourier transform) process is carried out for the original image to extract frequency components from the original image. The frequency components extracted are applied to a low-pass filter to extract only low frequency components. These low frequency components are subjected to an inverse FFT process to form an image with only the low frequency components. In this way, the low frequency components are extracted from the spatial frequency of the original image.

As in the case of the smoothing process described hereinbefore, the FFT, low-pass filter and inverse FFT processes may be effected after the original image is subjected to the maximum filtering process. In this case also, as in the case of the smoothing process, the low frequency components may be extracted with high precision from the spatial frequency of an image having large areas of darkness.

The low frequency components extracted from the spatial frequency of the original image by one of the various methods described above are normalized in the range of 0 to 1 to obtain sensitivity distribution data. In this way, the sensitivity distribution data may be obtained from the original image quickly by approximation (in the order of one second). This dispenses with a time-consuming operation as carried out in Method 1 of the prior art to calculate sensitivity distribution data all over again each time a change is made in the shape or position of the surface coil 3. There is no need also to carry out a troublesome operation as in Method 2 to determine sensitivity distribution data in advance or the align sensitivity distribution data with sectional images obtained by actually photographing an examinee.

However, with the sensitivity distribution data obtained in the manner described above, the sensitivity for background portions of the image derived tends to be much smaller than actual sensitivity as in Method 3 of the prior art. Consequently, when an output image is derived from equation (2) based on the product of the original image and inverse of the sensitivity distribution data obtained, the original image would have emphasis placed on noise in the background portions. Thus, according to this invention, correction factor data is obtained and applied to the original image for proper correction of the luminance thereof.

The correction factor calculator 12 derives correction factor data $\beta(x, y)$ from the following equations:

$$\beta(x, y) = f(\alpha(x, y)) \tag{3}$$

$$f(\alpha) = \alpha^2 - 3\alpha + 3 \tag{4}$$

That is, sensitivity distribution data $\alpha(x, y)$ determined for each pixel in the original image by the sensitivity distribution identifier 11 is successively substituted into equation (4) to obtain correction factor data $\beta(x, y)$ for each pixel in the original image.

The output image calculator 13 obtains luminance $j(x, y)$ of each pixel in the output image by calculating the product of correction factor data $\beta(x, y)$ of each pixel calculated by the correction factor calculator 12 and luminance $i(x, y)$ of each pixel in the original image received from the image regenerating unit 5. This calculation uses the following equation:

$$j(x, y) = i(x, y) * \beta(x, y) \tag{5}$$

Function $f(\alpha)$ in equation (4) above is derived from expression $1/\alpha$ for outputting the inverse of sensitivity $\alpha$, expanded by $\alpha=1$ based on Taylor's theorem to obtain up to the second order.

Figure 8:
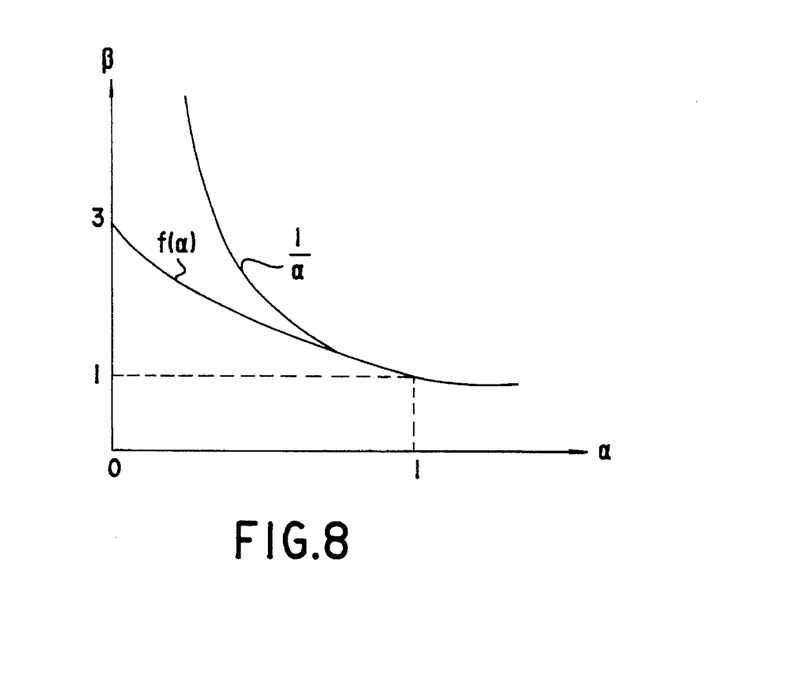
FIG. 8 is a graph showing a relationship between $1/\alpha$ and function $f(\alpha)$.

FIG. 8 shows a graph plotting function $f(\alpha)$ in equation (4) and $1/\alpha$. As seen from FIG. 8, when sensitivity $\alpha$ has the maximum value "1", correction factor data $\beta$ by function $f(\alpha)$ in equation (4) is "1" which corresponds to substitution of $1/\alpha$. When sensitivity $\alpha$ has the minimum value "0", substitution of $1/\alpha$ results in infinite correction factor data $\beta$ whereas function $f(\alpha)$ in equation (4) results in correction factor data $\beta$ having the value "3". Thus, by using equation (5) to derive the product of correction factor data $\beta$ and luminance of the original image for each pixel, luminance is corrected for portions of the original image having high sensitivity $\alpha$, with the same precision as in the prior art (the luminance correction based on equation (2)), while suppressing the luminance correction for the background portions of the original image having low sensitivity $\alpha$, thereby avoiding the emphasis on the noise components of the low sensitivity, background portions. Function $f(\alpha)$ is based only on addition, subtraction and multiplication, and does not include a division like $1/\alpha$, and hence an advantage of reduced processing time by a computer, compared with the case of $1/\alpha$.

While the above sensitivity distribution identifier 11 normalizes the low frequency components in the range of 0 to 1, the low frequency components extracted may be applied intact to the correction factor calculator 12 without such normalization. In this case, the correction factor calculator 12 may derive correction factor data $\beta(x, y)$ from the following equation (6) instead of equation (4) above:

$$f(\alpha) = (\alpha/N)^2 - 3(\alpha/N) + 3 \tag{6}$$

where N is a maximum value in the luminance range of the original image.

Figure 9:
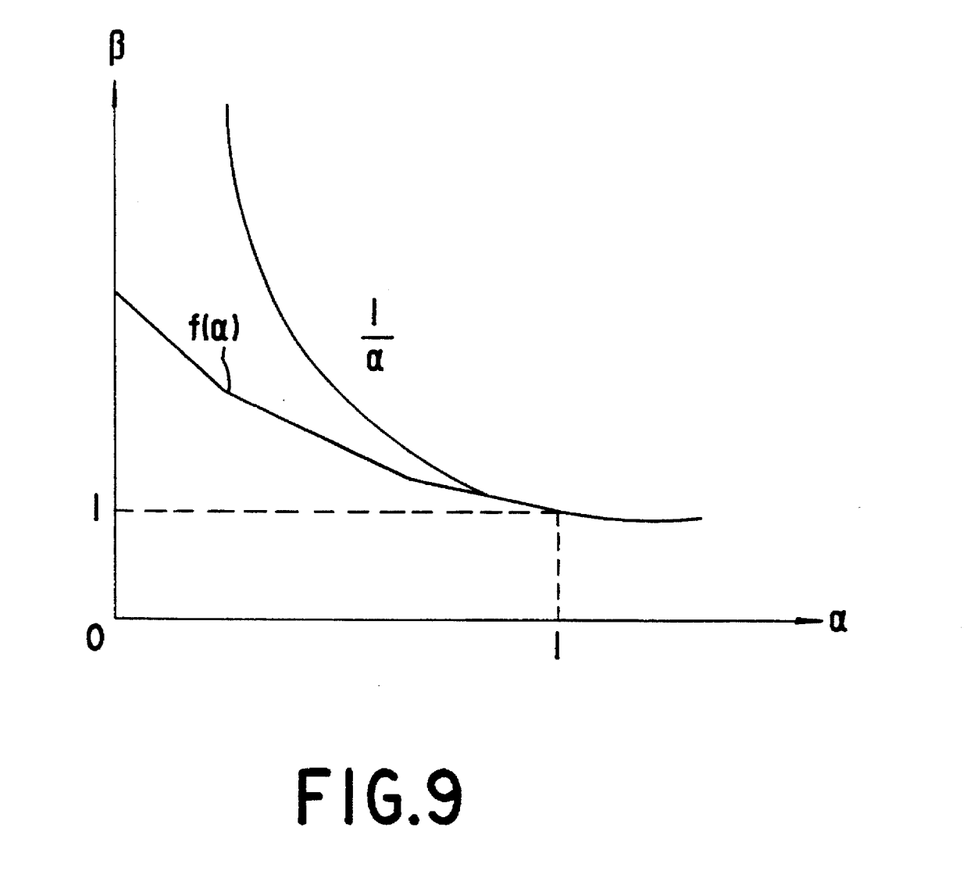
FIG. 9 is a graph showing a different function for obtaining correction factor data.

The function for calculating correction factor data $\beta(x, y)$ is not limited to equation (4) above (or equation (6)), but may be obtained, for example, by expanding the expression $1/\alpha$ providing the inverse of sensitivity $\alpha$, by $\alpha=1$ based on Taylor's theorem to obtain up to the fourth order. Or other functions may be used. The function is not limited to a curved function, but may be a combination of a plurality of linear functions as shown in FIG. 9. However, for a balance between the effect of correction for low sensitivity portions and suppression of noise stressing, it is preferred that correction factor data $\beta(x, y)$ does not exceed "10" when sensitivity $\alpha$ is zero. Further, with a view to shortening the time taken in calculating correction factor data $\beta(x, y)$, the function should preferably be up to a simple quadratic function.

The present invention may be embodied in other specific forms without departing from the spirit or essential attributes thereof and, accordingly, reference should be made to the appended claims, rather than to the foregoing specification, as indicating the scope of the invention.

What is claimed is:

1. A magnetic resonance imaging apparatus for obtaining sectional images based on nuclear magnetic resonance signals (NMR signals) released from an examinee, said apparatus comprising:

a surface coil for receiving said NMR Signals released from the examinee;

image generating means for obtaining a sectional image from said NMR signals received by said surface coil;

sensitivity distribution identifying means for obtaining sensitivity distribution data of said surface coil by extracting low frequency components from spatial frequency of the sectional image obtained;

correction factor calculating means for deriving correction factor data from said sensitivity distribution data, said correction factor data taking a value smaller than an inverse of a minimum value of said sensitivity distribution data when said sensitivity distribution data approaches said minimum value, and a value substantially corresponding to an inverse of a maximum value of said sensitivity distribution data when said sensitivity distribution data approaches said maximum value; and output image calculating means for calculating a sectional image with improved luminance by applying said correction factor data to said sectional image obtained.

2. An apparatus as defined in claim 1, wherein said sensitivity distribution identifying means is operable to obtain said sensitivity distribution data of said surface coil by effecting a smoothing process on said sectional image obtained, and extracting low frequency components from the spatial frequency of said sectional image obtained.

3. An apparatus as defined in claim 1, wherein said sensitivity distribution identifying means is operable to obtain said sensitivity distribution data of said surface coil by effecting a fast Fourier transform (FFT) on said sectional image obtained, subjecting said sectional image to a low-pass filter, and thereafter effecting an inverse FFT to extract low frequency components from the spatial frequency of said sectional image obtained.

4. An apparatus as defined in claim 2, wherein said sensitivity distribution identifying means is operable to effect a maximum filtering process on said sectional image obtained, in which all pixels in said sectional image obtained are successively treated as subject pixels, and each of said subject pixels is replaced with maximum luminance of pixels in a local region surrounding said each of said pixels, and to effect said smoothing process on results of said maximum filtering process.

5. An apparatus as defined in claim 3, wherein said sensitivity distribution identifying means is operable to effect a maximum filtering process on said sectional image obtained, in which all pixels in said sectional image obtained are successively treated as subject pixels, and each of said subject pixels is replaced with maximum luminance of pixels in a local region surrounding said each of said pixels, to effect said FFT on results of said maximum filtering process, to subject said sectional image to said low-pass filter, and thereafter to effect said inverse FFT.

6. An apparatus as defined in claim 1, wherein said correction factor calculating means is operable to derive correction factor data $\beta(x, y)$ from the following equations, based on sensitivity distribution data $\alpha(x, y)$ applied thereto (x, y being coordinates on an xy plane of each pixel in said sectional image obtained, and $\alpha(x, y)$ being normalized in a range of 0 to 1):

$$\beta(x, y) = f(\alpha(x, y))$$

$$f(\alpha) = \alpha^2 - 3\alpha + 3.$$

7. An apparatus as defined in claim 1, wherein said output image calculating means is operable to determine an output image by calculating a product $(i(x, y) * \beta(x, y))$ of luminance $i(x, y)$ (x, y being coordinates on an xy plane of each pixel in said sectional image obtained) and said correction factor data $\beta(x, y)$ (x, y being coordinates on an xy plane of each pixel in said sectional image obtained).

8. An apparatus as recited in claim 1, further comprising output means for outputting said sectional image calculated by said output image calculating means.

* * * * *